United States Patent [19]
Burr

[11] Patent Number: 6,005,693
[45] Date of Patent: Dec. 21, 1999

[54] METHOD FOR HOLOGRAPHIC STORAGE

[75] Inventor: Geoffrey William Burr, Cupertino, Calif.

[73] Assignee: International Business Machines Corporation, Armonk, N.Y.

[21] Appl. No.: 08/857,740

[22] Filed: May 16, 1997

[51] Int. Cl.[6] .............................. G02B 5/32; G03H 1/02; G11C 11/46
[52] U.S. Cl. .................. 359/21; 359/20; 359/3; 359/7; 365/125
[58] Field of Search ................. 359/1, 3, 7, 21, 359/30, 22; 356/125

[56] References Cited

U.S. PATENT DOCUMENTS

| | | | |
|---|---|---|---|
| 4,655,542 | 4/1987 | Dube .................................. | 350/3.64 |
| 5,313,320 | 5/1994 | Kornfield et al. ................... | 359/76 |
| 5,450,218 | 9/1995 | Heanue et al. ...................... | 359/21 |
| 5,511,058 | 4/1996 | Visel et al. ......................... | 369/103 |
| 5,561,287 | 10/1996 | Turner et al. ....................... | 250/208.2 |

OTHER PUBLICATIONS

G. W. Burr et al., "Modulation Coding for Pixel–matched Holographic Data Storage", *Optics Letters*, vol. 22, No. 9, May 1, 1997, pp. 639–641.

S. Campbell et al., "Absorption Effects in Photoefractive Volume–holographic Memory Systems", Part I, Beam Depletion, *Journal of the Optical Society of America*, vol 13, No. 10, Oct. 1996, pp. 2209–2217.

I. okgör et al., "Multilayer Disk Recording Using 2–photon Absorption and the Numerical Simulation of the Recording Process", *1997 Optical Data Storage Conference Digest*, Apr. 7–9, 1997, pp. 54–59.

J. P. Huignard et al., "Coherent Selective Erasure of Superimposed Volume Holograms in LiNbO$_3$", *Applied Physics Letters*, vol. 26, No. 5, Mar. 1, 1975, pp. 256–258.

H. Sasaki et al., "Gray–scale Fidelity in Volume–multiplexed Photorefractive Memory", *Optics Letters*, vol. 18, No. 16, Aug. 15, 1993, pp. 1358–1360.

*Primary Examiner*—Cassandra Spyrou
*Assistant Examiner*—Audrey Chang
*Attorney, Agent, or Firm*—Robert B. Martin; Thomas R. Berthold

[57] ABSTRACT

The present invention is a method for optical data storage which compensates for deterministic variations. The method comprises writing a two-dimensional image comprising a plurality of pixels into a recording medium while varying the exposure of individual ON pixels during the recording of the image to expose the weaker pixels more than brighter pixels.

13 Claims, 2 Drawing Sheets

METHOD FOR HOLOGRAPHIC STORAGE

This invention was made with government support under agreement number MDA972-94-2-0008 (ARPA Order No. A576) awarded by the Advanced Research Projects Agency. The government has certain rights in this invention.

TECHNICAL FIELD

The present invention relates to an improved method for optical data storage, and in particular to a method for holographic data storage which compensates for deterministic variations.

BACKGROUND OF THE INVENTION

In holographic recording, a light beam from a coherent monochromatic source (usually a laser) is split into two parts. One part of the beam (the object beam) is passed through a spatial light modulator (SLM) and then into a recording medium. A suitable SLM is a planar liquid crystal array having a plurality (e.g., 1024×1024) of individual liquid crystal panels. Each crystal panel has a transmissive state and a nontransmissive state. During the recording of a single two-dimensional image, some of the panels are in their transmissive (ON) state and some are in their nontransmissive (OFF) state. The other unmodulated portion of the beam strikes the recording medium directly (reference beam). The object beam and reference beam intersect in the recording medium to form a complex interference pattern which is recorded in the medium. After a data page has been recorded in the recording medium, the reference beam angle is changed and the next data page is recorded. In the reconstruction (readout) step, the reference beam alone strikes the recording medium and is diffracted by the recording medium to form a faithful copy of the original object beam. The diffracted beam is directed to a suitable detector, such as a charge-coupled device (CCD) detector array, which reads each pixel in the data page.

Unfortunately, during the readout process, errors may occur due to deterministic variations.

Deterministic variations are the same from data page to data page and are caused by nonuniformities in the object beam before its modulation, dust and other imperfections in the optics, nonuniform pixel response in the SLM or CCD, interpixel crosstalk, and absorption effects in the photosensitive crystal. Deterministic variations cause some ON pixels in the reconstructed data pages to be repeatably weaker than other ON pixels. These weaker ON pixels are more likely to be incorrectly read as OFF pixels.

An intuitive response to this problem would be to increase the recording time of each data page so that all ON pixels get brighter. Unfortunately, stored holograms are slowly erased during the recording process of a new hologram and increasing the recording time for each page merely exacerbates the erasure problem. Further, increasing recording time for each page also increases crosstalk from bright ON pixels into adjacent OFF pixels. There is still a need in the art for a recording method for compensating for deterministic variations.

It is therefore an object of the present invention to provide an improved method for optical data storage.

Other objects and advantages will become apparent from the following disclosure.

SUMMARY OF THE INVENTION

The present invention relates to a method for data storage which compensates for deterministic variations. The method of the present invention involves recording a single image comprising a plurality of bits using a storage device comprising an optical recording medium and a plurality of light sources, preferably lasers, for recording individual bits in the medium. Preferably, the storage device has a lens position between the light sources and the medium to focus the individual light beams into the medium. The method comprises writing a single image (plurality of bits simultaneously) into a recording medium while varying the exposure of individual light beams during the recording of the single image to expose the weaker bits more than brighter bits. The method of the present invention can be employed in a variety of optical storage technologies including preferably holographic storage and also optical tape storage, two-photon absorption storage (tape or disk), and electron-trapping optical storage. Preferably, the method of the present invention involves holographic storage. In holographic storage, the individual light sources are in a spatial light modulator, preferably a liquid crystal array illuminated by a laser. In one embodiment, during the holographic recording process for each two-dimensional image, individual liquid crystal panels corresponding to bright pixels are switched from a transmissive to a nontransmissive state after a short exposure time, while the remaining liquid crystal panels corresponding to the weaker pixels are maintained in the transmissive state for additional exposure of the recording medium. The recording time for each pixel can be varied to compensate for any deficiency, thereby enabling substantially uniform intensity for all pixels during readout.

A more thorough disclosure of the present invention is presented in the detailed description which follows and the accompanying drawing.

DETAILED DESCRIPTION OF THE INVENTION

Figure 1:
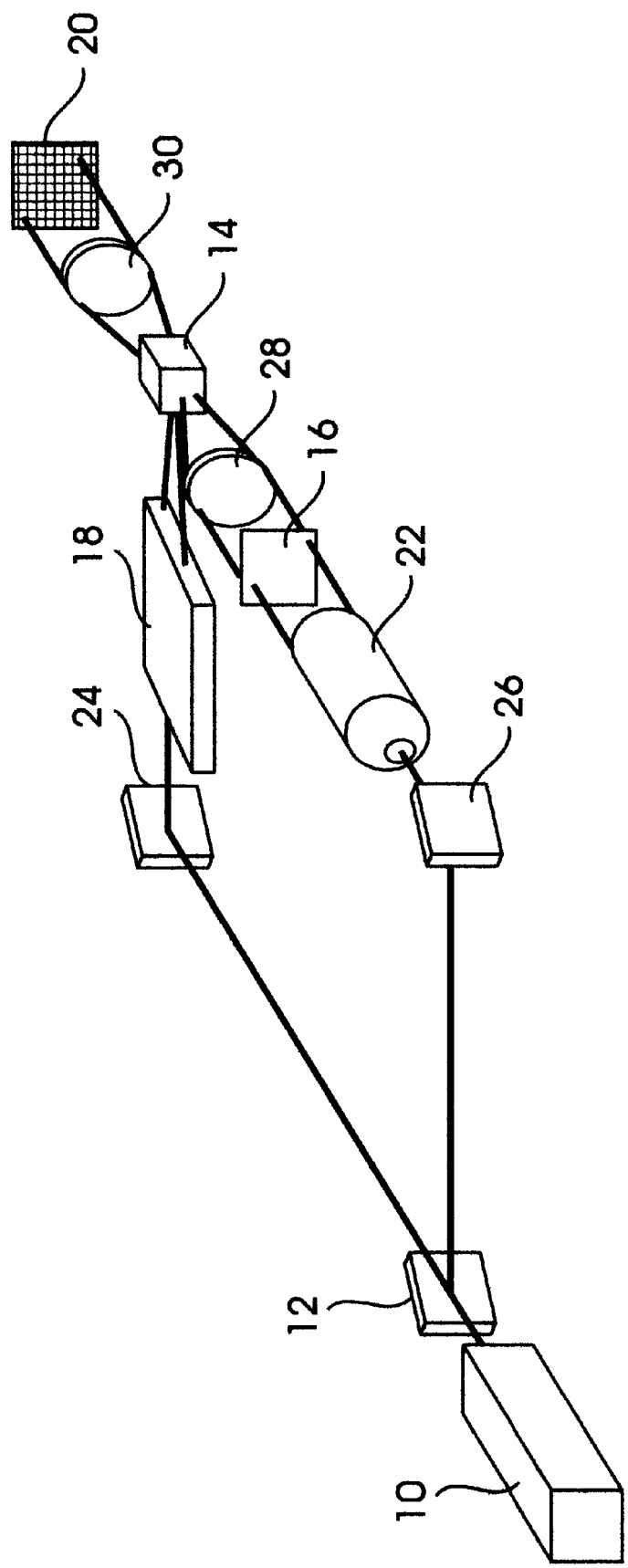
FIG. 1 is a view of a storage device of the present invention.

The present invention relates to a method for optical data storage which compensates for deterministic variations. Preferably, the method relates to holographic data storage. Referring to FIG. 1, there is shown a storage device for use in the method of the present invention generally comprising a laser 10 for providing a beam of coherent radiation, a beam splitter 12 for splitting the laser beam into an object and a reference beam, a photosensitive storage medium 14, and a spatial light modulator 16. The storage device also generally comprises beam-steering optics 18 to change the angle of the reference beam and CCD detector 20. The device also comprises beam expander 22, mirrors 24 and 26, and lenses 28 and 30.

Suitable sources of coherent monochromatic radiation are lower power, continuous-wave lasers such as diode lasers, argon lasers, Ti sapphire, Nd:YAG lasers, and repetitively Q-switched lasers.

Suitable beam splitters are polarizing or nonpolarizing cube beam splitters in conjunction with waveplates for polarization control.

Suitable photosensitive recording media are: (i) photochromic materials such as dichromated gelatin, photodimers such as anthracene, polymerizable materials such as disclosed in U.S. Pat. No. 5,013,632, and materials which isomerize such as stilbenes, and (ii) photorefractive materials such as a single photorefractive crystal and preferably a ferroelectric photorefractive crystal. As used herein, the term "ferroelectric" refers to crystals exhibiting an electric dipole moment even in the absence of an external electric field. Suitable photorefractive media are lithium niobate, potassium lithium niobate, lithium tantalate, barium titanate, strontium barium niobate (SBN), lead barium niobate (PBN), barium strontium potassium sodium niobate (BSKNN), potassium tantalate niobate, bismuth silicate, and bismuth germanate. Preferred ferroelectric host media are lithium niobate, lithium tantalate, barium titanate, and SBN. Other suitable host media will be known to those skilled in the art. Preferably, the medium is doped with a transition metal (e.g., iron) or a rare earth metal, such as praseodymium, to increase photosensitivity.

The dopants are generally doped into the ferroelectric medium by art-known processes. The doped ferroelectric crystals of this invention may also be purchased from vendors such as Virgo Optics of Port Richey, Fla.; Deltronic Crystal Industries, Inc., of Dover, N.J., CSK Optronics of Culver City, Calif.; and JTT International of Orlando, Fla.

Suitable spatial light modulators are liquid crystal modulators and micromechanical reflection modulators. The structure and operation of such modulators are disclosed by K. Schwartz in "The Physics of Optical Recording", Springer-Verlag, 1993, which is incorporated herein by reference for all purposes. The operational parameters for holographic storage and components for holographic storage devices are well known in the art for crystalline photorefractive materials such as disclosed in Collier et al., "Optical Holography", Chapter 16, *Academic Press,* 1991, the disclosure of which is incorporated herein by reference for all purposes.

The first step of a holographic process of the present invention involves generating a beam of coherent electromagnetic radiation (e.g., from a laser), preferably monochromatic. The second step involves splitting that beam of coherent radiation into an object and reference beam. The third step of the process involves directing the object beam to a spatial light modulator to modulate the object beam in accordance with the present invention. The last step involves intersecting the modulated object beam and the reference beam in the recording medium to record the image. A plurality of mirrors can be utilized to direct the beams to the medium.

The spatial light modulator functions to modulate the object beam to correspond to a two-dimensional image comprising a plurality of pixels (bits) which is to be recorded in the recording medium. The spatial light modulator comprises a plurality of individual modulating elements, each having at least a first state which allows the beam of radiation incident on the element to strike the recording medium and a second state which prohibits at least a portion of the incident beam of radiation from striking the recording medium. Preferably, the spatial light modulator is a liquid crystal array where, in one embodiment, the individual elements are individual liquid crystal panels, each having at least a first state which is transmissive to the incident radiation and a second state which is at least partially nontransmissive (e.g., completely nontransmissive). Each panel is a liquid crystal cell comprising a liquid crystalline material sandwiched between two electrodes and two polarizers which are rotated (e.g., 90°) with respect to each other. During the process for modulating the object beam to record a single two-dimensional image (e.g., generally less than 1 second), some of the ON elements of the spatial light modulator are in the second state for at least a portion of the time it takes to modulate the object beam to create the image (e.g., the element is switched from the first state to the second state). These ON elements allow at least, and only a portion of, the radiation incident on the element during the process to record the single two-dimensional image to strike the recording medium. For example, with a binary liquid crystal array, initially all of the ON pixels would be in their transmissive state. Then, during the time required to record the single two-dimensional image (e.g., the time to modulate the beam which records the image in the medium), some of the ON pixels (the brighter pixels) are switched to their nontransmissive state and the remaining ON pixels (the weaker pixels) continue to modulate the incident radiation beam until the beam has been completely modulated to record the single two-dimensional image in the medium.

After the single two-dimensional image has been recorded in the medium, the storage device is modified to enable the recording of another two-dimensional image in the medium. The recording device can be modified by changing the angle of the reference beam (e.g., with a galvanometer scanner or acoustic optic beam deflector) or the wavelength of the reference beam. After changing the angle of the reference beam, the next two-dimensional image is recorded in the recording medium.

In an alternative embodiment, the bright ON pixels are in their nontransmissive state at the beginning of the process for modulating the object beam to record the image and are switched to their transmissive state prior to the completion of the modulation process.

In another alternative embodiment, the liquid crystal panels have more than two states where one or more intermediate states are partially transmissive, e.g., they allow only a portion of the radiation incident on the panel to intersect the recording medium. These panels can be utilized to provide gray-scale recording. The ON panels can be set to such an intermediate state during the recording process of a single two-dimensional image to allow only a portion of the light incident on the panel during the recording process to strike the recording medium.

The recorded two-dimensional image is read from the medium with a monochromatic read beam having a wavelength equal to the recording beam. The light from the reading beam is diffracted by the medium. The diffracted beam then conveniently passes through a lens to produce a two-dimensional image which is captured by a detector array such as a charge-coupled device (CCD). Output from the detector array can be converted into a serial binary form suitable to input into standard computer central processing units.

The process of the present invention overexposes weak "ON" pixels during the recording process so that the readout of the image appears to have no deterministic variations. Since only random noise remains, more holograms can be superimposed before the signal-to-noise ratio falls below an acceptable level. Further, since more uniformity variations can be tolerated in the SLM and CCD, the cost of these components is reduced.

The weak pixels, due to deterministic variations, can be identified by a simple technique. A hologram is stored in the medium with all the pixels in the ON state. The hologram is then read and weak pixels identified. The spatial light modulator is then programmed to compensate for these weak pixels.

An alternative method for identifying weak pixels is the envelope method. This involves the combination of two sources of information about pixel effects. The first is an image of the desired data pattern transmitted through the storage material. This provides information on variations due to CCD pixels, SLM pixels, and crosstalk from neighboring pixels. The second source is a stored hologram of the all-ON page for which the weak pixels were identified from the image of the all-ON page. This second source provides information on how the process of storing the hologram affects the uniformity. (If there were no such effects, this second source would already be completely uniform.) The weak pixels are identified from the product of the two sources of information. After the weaker pixels have been identified, the spatial light modulator is programmed so that when those pixels are ON, the pixel exposure time is extended accordingly to compensate for the pixel weakness.

The method of the present invention can also be utilized in optical tape storage and two-photon recording such as disclosed in *Optical Data Storage Conference Digest*, April 1997, pp. 54–59, the disclosure of which is incorporated herein by reference for all purposes. In two-photon recording, the recording medium is also struck by a second beam of light (optionally monochromatic) having a wavelength different from the plurality of light beams which are also striking the recording medium.

The following examples are detailed descriptions of the process of the present invention. The detailed preparations fall within the scope of, and serve to exemplify, the more generally described methods set forth above. The examples are presented for illustrative purposes only, and are not intended as a restriction on the scope of the invention.

EXAMPLE

The method of the invention was demonstrated on the DEMON holographic storage demonstrator described in *Laser Focus World* 81 (November 1996). The DEMON had an argon 514.5 nm laser which was routed to the system via fiber, and split into the object and reference paths. The object beam was expanded to overfill the input aperture of the SLM, sacrificing power for beam uniformity. The SLM was an Epson 640×480 transmissive liquid crystal panel with 42 $\mu$m pixel spacing and 41% areal fill factor. The spatially modulated beam was demagnified by a custom 5-element zoom lens, forming a pixel-matched image in the zoom lens output plane. This plane coincided with the input plane of a folded 4-F system, with two Fourier transform lenses of 89 mm focal length. The CCD camera was a Pulnix TM6701AN with a 640×480 Kodak KAI-0310M CCD chip running at 60 frames per second. The CCD pixels were on a 9 $\mu$m grid. Since the zoom lens was not designed for magnifications over 3.0, the 42 $\mu$m spacing of the SLM was demagnified to an 18 $\mu$m grid and only the center 320×240 pixels of the SLM were seen by the camera. Since each incoming SLM pixel image was centered on a single CCD pixel, there was no oversampling or postprocessing. The Pulnix camera was used as if it were a 320×240 pixel camera with 18 $\mu$m spacing and 15% areal fill factor. The camera and SLM each had two New Focus Picomotor stages for registration of the pixel grids. These allowed alignment either of the SLM to the CCD, or of the CCD to a stored hologram, and were needed only periodically depending on changes in ambient temperature. An acousto-optic modulator (AOM) at the fiber input reduced the incident flux during object beam alignment.

In this system, the Fourier transform plane was positioned 2–3 cm behind the square exit face of the 8 mm×15 mm LiNbO$_3$ (0.02% Fe) crystal, and an aperture placed to pass only the central nine orders of the Fourier spectrum (0.81 cm$^2$). With this large aperture, the point-spread function was narrow and interpixel crosstalk negligible. A Cambridge Instruments 602HC-6650 galvanometric mirror positioner (1.5 msec settling time, 1.5 $\mu$rad repeatability) was used to deflect the reference beam for angle multiplexing.

Figure 2:
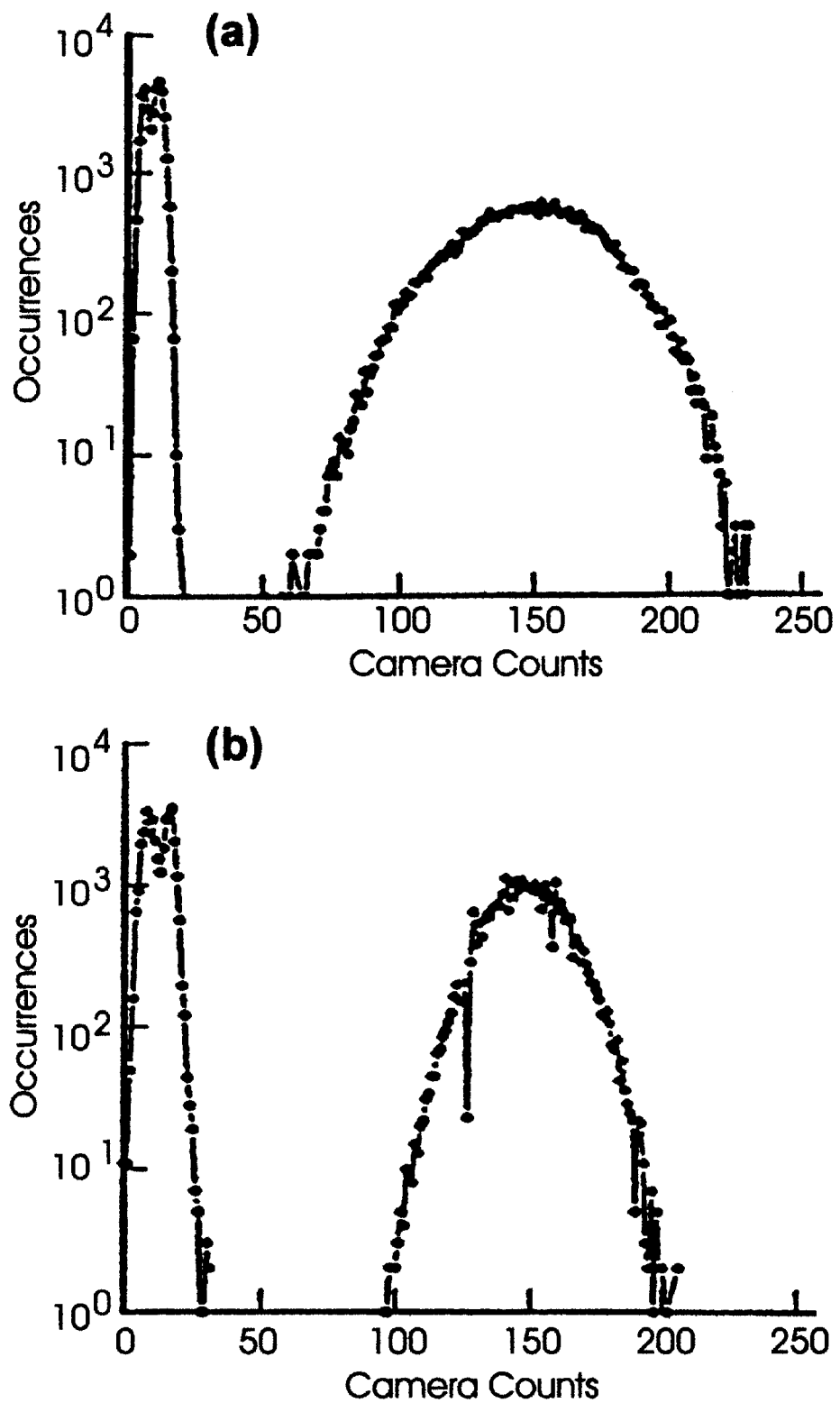
FIG. 2 is a histogram of corrected and uncorrected holograms.

To determine channel behavior, a practice hologram was recorded and read back. Certain pixels were weaker in detected intensity than the average pixel. These pixels were then scheduled (in the SLM) for enhanced exposure during corrected recording. FIGS. 2A–2B show the histogram of the uncorrected (a) and corrected holograms (b). The corrected hologram had 20 time slots which range over a factor of 2 in exposure time. The signal-to-noise ratio $$SNR \equiv \frac{\mu_{ON} - \mu_{OFF}}{\sqrt{\sigma_{ON}^2 + \sigma_{OFF}^2}}$$

is calculated from the camera count values, and the bit-error rates are extrapolations asuming the use of the balanced block 6:8 code developed by the IBM Holographic Optical Storage Team [Reference: *Optics Letters*, Vol. 22, May 1, 1997, page 639]. The uncorrected histogram had SNR of 5.46 and an estimated probability of error ($P_e$) of $1.2 \times 10^{-12}$ and the corrected histogram had SNR of 9.13 and an estimated $P_e$ of $1.8 \times 10^{-30}$.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention as described in the following claims.

What is claimed is:

1. A method for recording in a holographic storage device an interference pattern representing a single data page having a two-dimensional pattern of pixels, the data storage device comprising
    (i) a laser for generating coherent radiation,
    (ii) a beam splitter for splitting the beam of coherent radiation into a reference beam and an object beam,
    (iii) a recording medium,
    (iv) a spatial light modulator for receiving the data page to be recorded and comprising a plurality of individual modulating elements for generating ON and OFF pixels, each element having an ON state which allows at least a portion of the object beam of radiation incident on the element to strike the recording medium to record an ON pixel and a second state which substantially prevents the object beam of radiation incident on the element from striking the recording medium to record an OFF pixel, and
    (v) a detector for detecting the recorded interference pattern as a data page having a two-dimensional pattern of bright and dark pixels representing ON and OFF pixels, respectively, when the recorded interference pattern is illuminated by the reference beam, and wherein certain recorded strong ON pixels are brighter than other recorded weak ON pixels as a result of varying amounts of the incident object beam striking the recording medium from the modulating elements in their ON state, the method comprising the steps of:
    (a) generating a beam of coherent radiation;
    (b) splitting the beam of coherent radiation into a reference beam and an object beam;

(c) directing the object beam to the spatial light modulator that has received the single data page to modulate the object beam, some of the elements of the modulator being in the ON state;

(d) intersecting the object beam and reference beam in the recording medium to record the interference pattern representing the single data page; and (e) during the recording of the interference pattern representing the single data page, maintaining the modulator elements that produce weak ON pixels in the ON state for a period of time longer than the modulator elements that produce strong ON pixels.

2. The method of claim 1 wherein the recording medium is a photorefractive crystal.

3. The method of claim 2 wherein the crystal is doped with a rare earth element.

4. The method of claim 2 wherein the spatial light modulator is a liquid crystal modulator or a micromechanical reflection modulator.

5. The method of claim 4 wherein the laser is an argon laser.

6. The method according to claim 1 wherein the maintaining step comprises switching the modulator elements that produce strong ON pixels to the OFF state while maintaining the modulator elements that produce weak ON pixels in the ON state.

7. The method according to claim 1 wherein the maintaining step comprises setting the modulator elements that produce strong ON pixels to the OFF state at the beginning of the recording and then switching the modulator elements that produce strong ON pixels to the ON state prior to the completion of the recording.

8. The method according to claim 1 further comprising, prior to receipt of the single data page by the spatial light modulator:

switching all of the modulator elements to the ON state;

directing the object beam to the spatial light modulator having all of its elements in the ON state;

intersecting, in the recording medium, the reference beam and the object beam from the spatial light modulator having all of its elements in the ON state to record a reference interference pattern;

detecting from the reference interference pattern the strong ON pixels; and wherein the maintaining step comprises maintaining the modulator elements that produce weak ON pixels in the ON state for a period of time longer than the modulator elements that produce those previously detected strong ON pixels.

9. A method for recording in a holographic storage device an interference pattern representing a single data page having a two-dimensional pattern of pixels, the data storage device comprising (i) a laser for generating coherent radiation, (ii) a beam splitter for splitting the beam of coherent radiation into a reference beam and an object beam, (iii) a recording medium, (iv) a spatial light modulator for receiving the data page to be recorded and comprising a plurality of individual modulating elements for generating ON and OFF pixels, each element having an ON state which is transmissive to allow substantially all of the object beam of radiation incident on the element to strike the recording medium to record an ON pixel, a second state which is nontransmissive to substantially prevent the object beam of radiation incident on the element from striking the recording medium to record an OFF pixel and an intermediate state which is partially transmissive to allow only a portion of the object beam of radiation incident on the element to strike the recording medium, and (v) a detector for detecting the recorded interference pattern as a data page having a two-dimensional pattern of bright and dark pixels representing ON and OFF pixels, respectively, when the recorded interference pattern is illuminated by the reference beam, and wherein certain recorded strong ON pixels are brighter than other recorded weak ON pixels as a result of varying amounts of the incident object beam striking the recording medium from the modulating elements in their ON state, the method comprising the steps of:

(a) generating a beam of coherent radiation;

(b) splitting the beam of coherent radiation into a reference beam and an object beam;

(c) directing the object beam to the spatial light modulator that has received the single data page to modulate the object beam, some of the elements of the modulator being in the ON state;

(d) intersecting the object beam and reference beam in the recording medium to record the interference pattern representing the single data page; and (e) during the recording of the interference pattern representing the single data page, maintaining the modulator elements that produce strong ON pixels in their intermediate state.

10. The method of claim 9 wherein the recording medium is a photorefractive crystal.

11. The method of claim 10 wherein the crystal is doped with a rare earth element.

12. The method of claim 10 wherein the spatial light modulator is a liquid crystal modulator or a micromechanical reflection modulator.

13. The method of claim 12 wherein the laser is an argon laser.

* * * * *